(12) United States Patent
Fajardo et al.

(10) Patent No.: US 7,755,124 B2
(45) Date of Patent: Jul. 13, 2010

(54) LAMINATING MAGNETIC MATERIALS IN A SEMICONDUCTOR DEVICE

(75) Inventors: Arnel M. Fajardo, Beaverton, OR (US);
Ebrahim Andideh, Portland, OR (US);
Changmin Park, Portland, OR (US);
Patrick Morrow, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 822 days.

(21) Appl. No.: 11/527,774

(22) Filed: Sep. 26, 2006

(65) Prior Publication Data

US 2008/0075974 A1 Mar. 27, 2008

(51) Int. Cl.
*H01L 29/76* (2006.01)
*H01L 29/94* (2006.01)
*H01L 21/00* (2006.01)

(52) U.S. Cl. ............... 257/295; 257/E27.005; 438/3; 428/800; 428/811; 428/812

(58) Field of Classification Search .............. 438/3, 438/22, 24–26, 28, 34, 39; 257/295, E27.005, 257/21, 22, E31.127, E31.129; 428/800, 428/811, 811.2, 812, 820.1, 812.8
See application file for complete search history.

(56) References Cited

U.S. PATENT DOCUMENTS

| | | | |
|---|---|---|---|
| 6,259,585 B1 * | 7/2001 | Sasaki et al. | 360/317 |
| 6,346,336 B1 * | 2/2002 | Nago | 428/800 |
| 6,479,898 B1 * | 11/2002 | Hopper et al. | 257/751 |
| 2004/0213071 A1 * | 10/2004 | Hiramoto et al. | 365/232 |
| 2004/0248403 A1 | 12/2004 | Dubin et al. | 438/637 |
| 2006/0214204 A1 * | 9/2006 | Yoo et al. | 257/295 |

\* cited by examiner

*Primary Examiner*—Hsien-ming Lee
(74) *Attorney, Agent, or Firm*—Trop, Pruner & Hu, P.C.

(57) ABSTRACT

A technique includes forming overlaying magnetic metal layers over a semiconductor substrate. The technique includes forming at least one resistance layer between the magnetic metal layers.

23 Claims, 6 Drawing Sheets

LAMINATING MAGNETIC MATERIALS IN A SEMICONDUCTOR DEVICE

BACKGROUND

The invention generally relates to laminating magnetic materials in a semiconductor device.

A semiconductor package (or chip) may include a voltage regulator that is fabricated in a die of the package. The voltage regulator typically includes an inductive component, such as an inductor or transformer, which the regulator energizes and de-energizes for purposes of regulating an output voltage of the regulator.

Conventionally, an integrated inductive component of the voltage regulator may be formed by depositing a magnetic metal layer on the die, which forms a magnetic core for the inductive component. Due to the nature of magnetic materials, during operation, the magnetic metal layer may give rise to significant eddy currents, which result in power losses. As a more specific example, conventional magnetic metal materials, such as phase vapor deposited CoZrTa and electroplated NiFe, have resistivities of 100 $\mu\Omega \cdot cm$ or lower. The resulting power loss from eddy currents in the magnetic metal layer may contribute significantly to the overall power loss for the voltage regulator.

Thus, there is a continuing need for better ways to fabricate a magnetic core in a semiconductor device.

DETAILED DESCRIPTION

Figure 1:
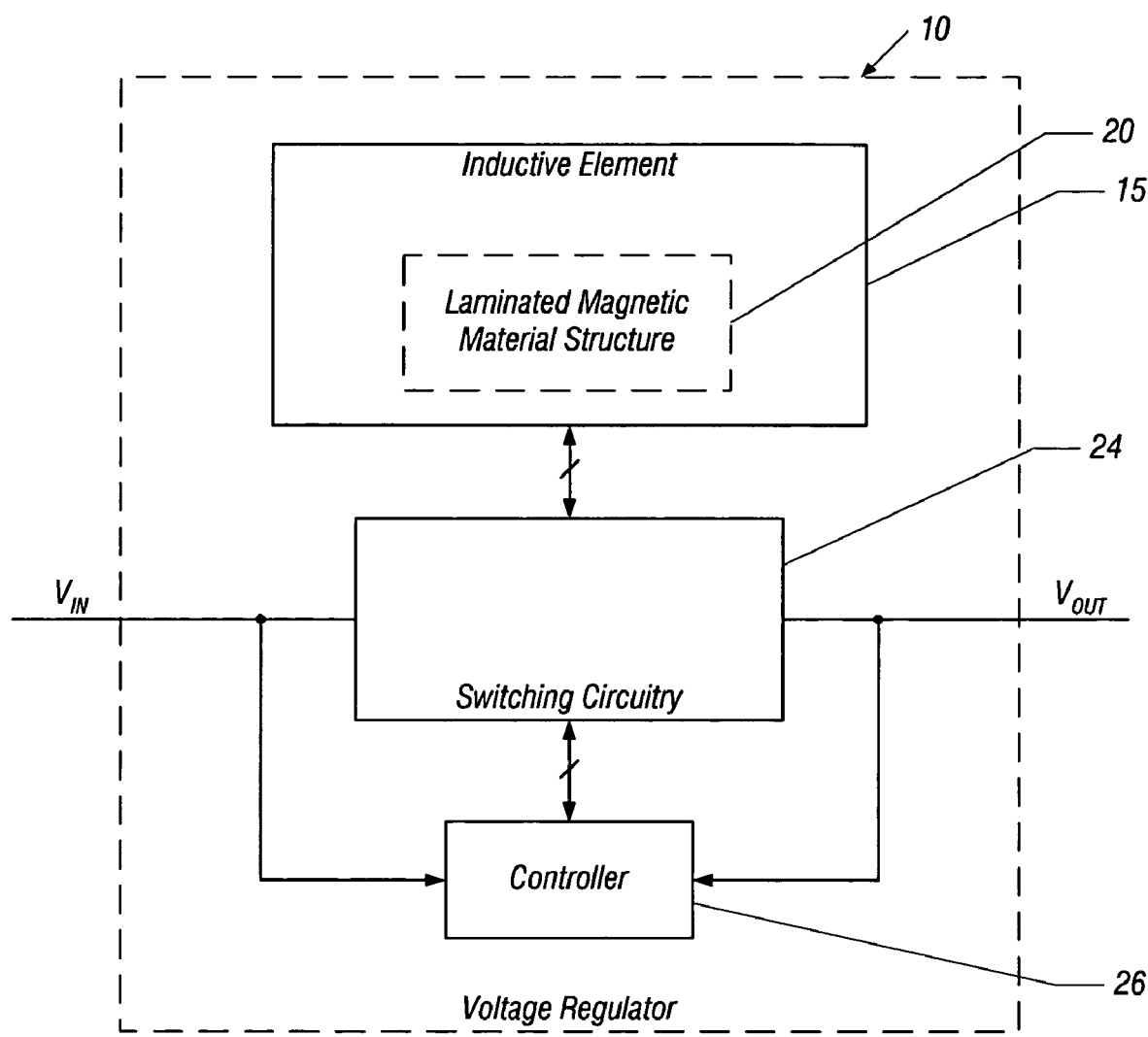
FIG. 1 is a schematic diagram of a voltage regulator according to an embodiment of the invention.

Referring to FIG. 1, in accordance with embodiments of the invention described herein, an integrated voltage regulator 10 is fabricated on a semiconductor die. The voltage regulator 10 includes an inductive element 15 (an inductor or transformer, as examples), which has a magnetic core that is formed from a laminated magnetic material structure 20. The structure 20, as further described below, includes overlaying magnetic metal layers that are separated by high-resistivity layers, such as layers of metal nitride, for example. Thus, instead of being formed from a single magnetic metal layer having a thickness T, the structure 20 has n magnetic metal layers, each of which has a thickness T/n. Due to the intervening high-resistivity layers, eddy currents in the magnetic core are significantly diminished, as compared to a magnetic device that has a single magnetic metal layer.

The structure 20 may serve a variety of different applications, other than its use in a voltage regulator, as the voltage regulator 10 is depicted in FIG. 1 for purposes of illustrating one out of many possible applications of the structure 20. As shown in FIG. 1, in accordance with some embodiments of the invention, the voltage regulator 10 may be a switching-type regulator that uses switching circuitry 24 for purposes of energizing and de-energizing the inductive element 15 to convert an input voltage (called "$V_{IN}$") into a regulated output voltage (called "$V_{OUT}$"). Among its other features, the voltage regulator 10 may include a controller 26 that possibly monitors one or more parameters of the regulator 10, such as the $V_{IN}$ and $V_{OUT}$ voltages, and controls the switching circuitry 24 accordingly to regulate the $V_{OUT}$ voltage.

Figure 2:
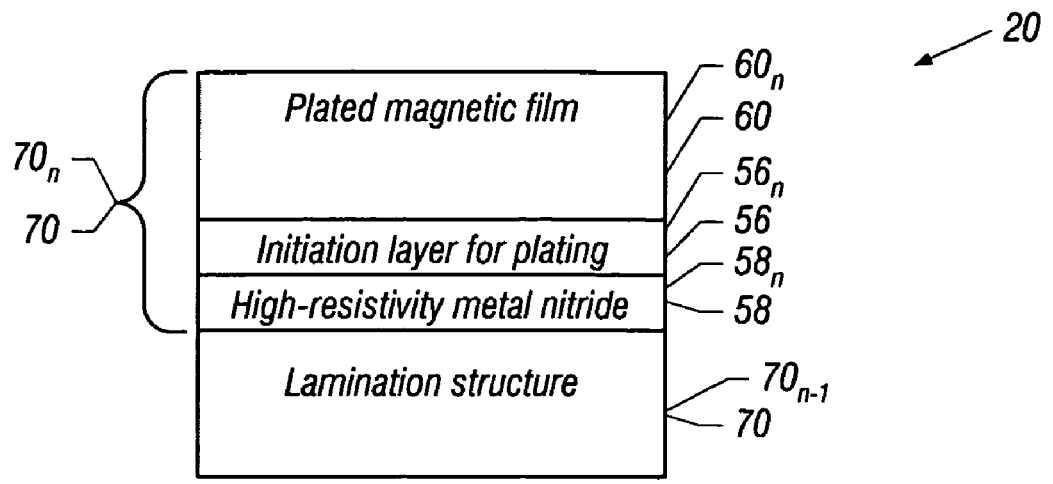
FIGS. 2, 4 and 5 are schematic diagrams of laminated magnetic material structures according to embodiments of the invention.
Figure 2:
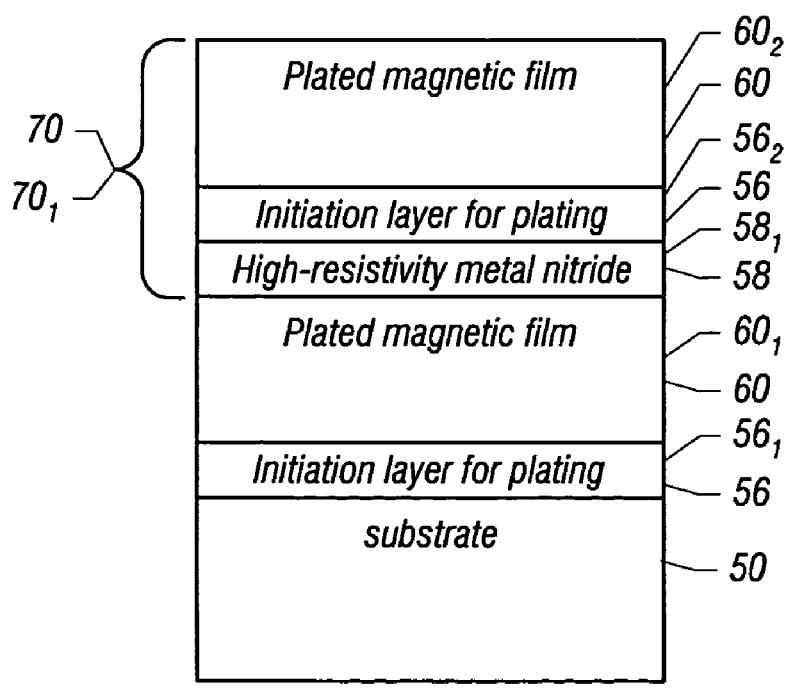

Referring to FIG. 2, in accordance with some embodiments of the invention, the structure 20 is fabricated on a semiconductor substrate 50 and is generally formed from n overlaying plated magnetic layers, or films 60 (magnetic films $60_1$, $60_2 \ldots 60_n$, being depicted as examples). The structure 20 also includes n intervening high resistivity metal nitride layers 58 (metal nitride layers $58_1$ and $58_n$, being depicted as examples) that are interdisposed between adjacent magnetic films 60 for purposes of reducing eddy current losses. As depicted in FIG. 2, in accordance with some embodiments of the invention, each high resistivity metal nitride layer 58 may be located over an associated plated magnetic film 60 in the laminated structure 20.

For purposes of facilitating the plating of the magnetic films 60, initiation layers 56 (initiation layers $56_1$, $56_2$ and $56_n$, being depicted as examples) are deposited on the substrate 50 (for the initiation layer $56_1$) and the metal nitride layers 58 (for the initiation layers $56_2 \ldots 56_n$). The composition of the initiation layer 56 depends on whether electroplating or electroless plating is used for purposes of forming the magnetic films 60.

More specifically, in accordance with some embodiments of the invention, electroplating is used to form the magnetic films 60. For these embodiments of the invention, a metal such as Ni, Co, or Cu may be deposited by vapor deposition on the substrate 50 for purposes of forming the first initiation layer $56_1$. The initiation layer $56_1$ increases the adhesion of the magnetic film 60 to the substrate 50 and provides a source of nucleation for the ensuing magnetic film $60_1$. After the initiation layer $56_1$ is deposited, the magnetic film $60_1$ is then plated on top of the layer $56_2$. Next, a high-resistivity metal nitride layer $58_1$ is deposited on the plated magnetic film $60_1$. This is proceeded by the deposition of another initiation layer $56_2$, which is followed by the plating of another magnetic film $60_2$, etc.

For embodiments of the invention in which the magnetic films are formed by electroless plating, each initiation layer 56 may be a palladium monolayer, which is formed with a palladium immobilization process, such as the one described in U.S. Patent Application Publication No. 2004/0248403A1, entitled, "METHOD FOR FORMING ELECTROLESS METAL LOW RESISTIVITY INTERCONNECTS," which published on Dec. 9, 2004.

As can be appreciated from FIG. 2, the above-described lamination process forms a repeating lamination structure 70, a structure that includes at its base a high-resistivity metal nitride layer 58, a middle overlaying initiation layer 56 and an upper magnetic film 60 that overlays the initiation layer 56. The lamination structure 70 is repeated (as depicted by exemplary lamination structures $70_1$, $70_{n-1}$ and $70_n$ in FIG. 2), depending on the number of magnetic films 60 in the overall structure 20.

Although FIG. 2 depicts four magnetic metal layers (i.e., magnetic films 60), the structure 20 may include more or fewer magnetic metal layers, depending on the particular embodiment of the invention. Thus, in accordance with some embodiments of the invention, the structure 20 may include two (n=2) magnetic metal layers; and as another example, in other embodiments of the invention, the structure 20 may include seven (n=7) magnetic metal layers. Thus, many variations are possible and are within the scope of the appended claims.

Figure 3:
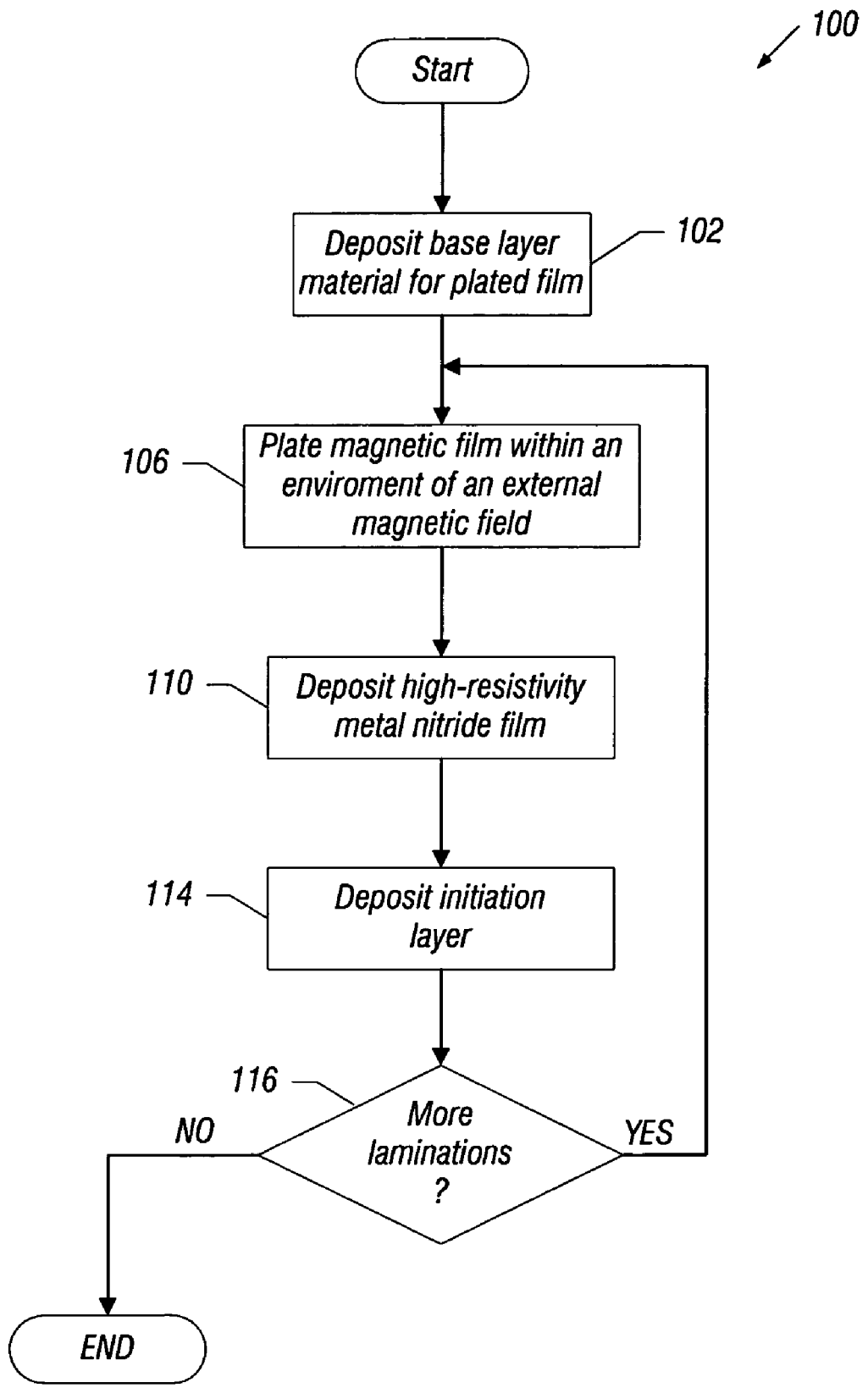
FIG. 3 is a flow diagram depicting a technique to form a laminated magnetic material structure according to an embodiment of the invention.

To summarize, in accordance with some embodiments of the invention, a technique 100 that is depicted in FIG. 3 may be used to form lamination structure 20. Referring to FIG. 3 in conjunction with FIG. 2, in accordance with some embodiments of the invention, a base layer is first deposited (block 102), such as the initiation layer $56_1$, for purposes of forming the bottom of the structure 20. The base layer may be a seed layer (i.e., a layer greater than 200 Å) that serves as an electrical contact for electroplating; or alternatively, the base layer may be a thin nucleation layer (a layer between 10 to 20 Å) that initiates electroless plating.

Next, pursuant to the technique 100, a magnetic film is plated (block 106) within an environment of an external magnetic field. Following the example depicted in FIG. 2, this corresponds to the formation of the magnetic film $60_1$. As examples, the magnetic film 60 may include Co, Ni and/or Fe as the primary metal, with alloying elements of B, P, W, C and O. The external magnetic field, in accordance with some embodiments of the invention, has a strength of approximately 500 to 1000 Oe at the wafer surface and is aligned parallel with the film plane. The thickness of the magnetic film 60 is 1/n of the final desired thickness is the number of laminations to be formed.

Next, pursuant to the technique 100, a high-resistivity metal nitride film (corresponding to the metal nitride layer $58_1$) is deposited (block 110) by such vapor deposition methods as physical vapor deposition (PVD), chemical vapor deposition (CVD) or atomic layer deposition (ALD), as examples. In accordance with some embodiments of the invention, the thickness of each metal nitride film 58 is on the order of 100 Å, depending on the targeted film resistance. Typical metal nitrides may include such materials as TaN, TiN, WN, and MoN. In accordance with some embodiments of the invention, carbon (C) or silicon ($S_i$) may be part of the metal nitride alloy. For example, in accordance with some embodiments of the invention, the metal nitride layer may be TaSiN. The metal nitride layer 58 may be deposited with a high nitrogen content in order to maximize its resistivity. As more specific examples in accordance with some embodiments of the invention, a TaN film with a resistivity of 3,000 μΩ·cm may be deposited via PVD at a nitrogen gas content of greater than 25 percent.

Next, according to the technique 100, an initiation layer 56 (such as the initiation layer $56_1$ depicted in FIG. 2) is deposited (block 114). For purposes of electroplating the magnetic film 60, the initiation layer 56 may include such metals as Ni, Co and Cu, which may be deposited by vapor deposition. These metals serve to both increase adhesion of the magnetic material to the metal nitride layer 58 and provide a source of nucleation for the ensuing magnetic film. Alternatively, block 114 may include depositing a palladium (Pd) monolayer, which may be accomplished, for example, by using the above-mentioned palladium immobilization process in Application Publication No. 2004/0248403A1.

If more laminations are to be formed (diamond 116), then the next magnetic film layer 60 is plated, pursuant to block 106, and the above-described lamination process repeats.

Figure 4:
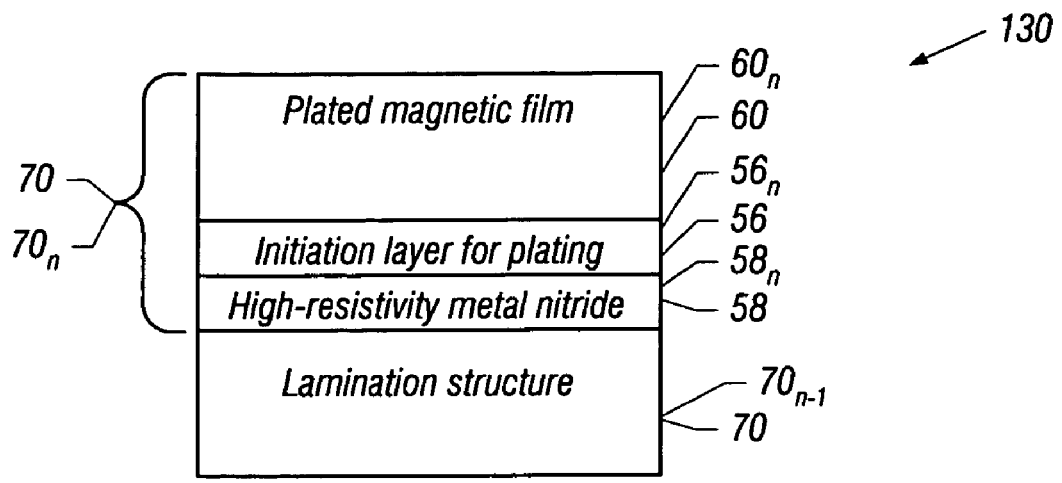
Figure 4:
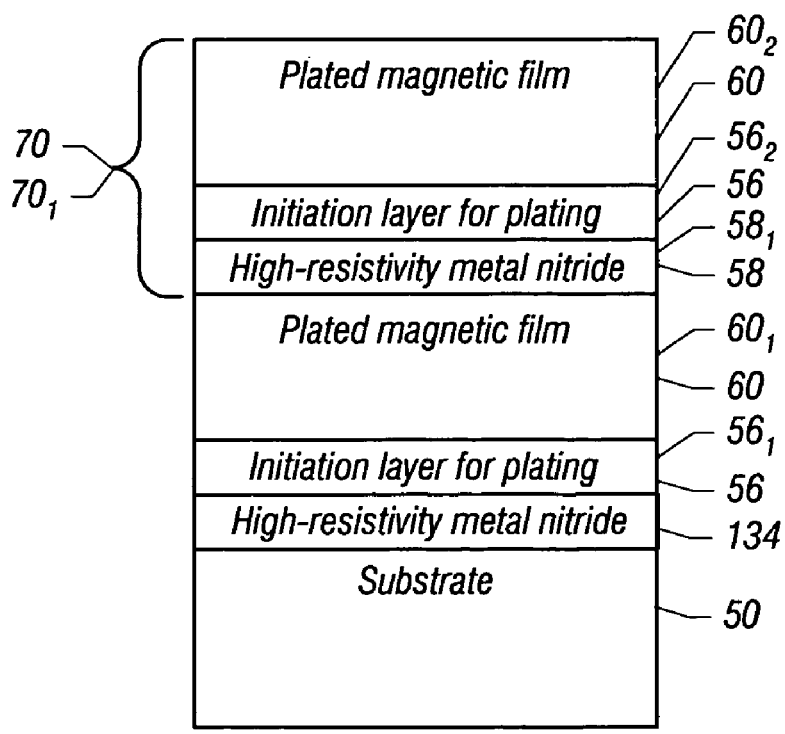

Many variations are possible and are within the scope of the appended claims. For example, referring to FIG. 4, in accordance with some embodiments of the invention, a laminated magnetic structure 130 may replace the structure 20. The structure 130 is similar to the structure 20, with like reference numerals being used to denote similar elements. The structures 20 and 130 differ as follows. In particular, unlike the structure 20, the structure 130 includes a high-resistivity metal nitride layer 134, which is disposed between the substrate 50 and the bottom initiation layer $56_1$. The metal nitride layer 134 aids in integrating the structure 130 into additional circuitry, which may include, for example, an oxide layer (not shown) that is in contact with the metal nitride layer 134.

Figure 5:
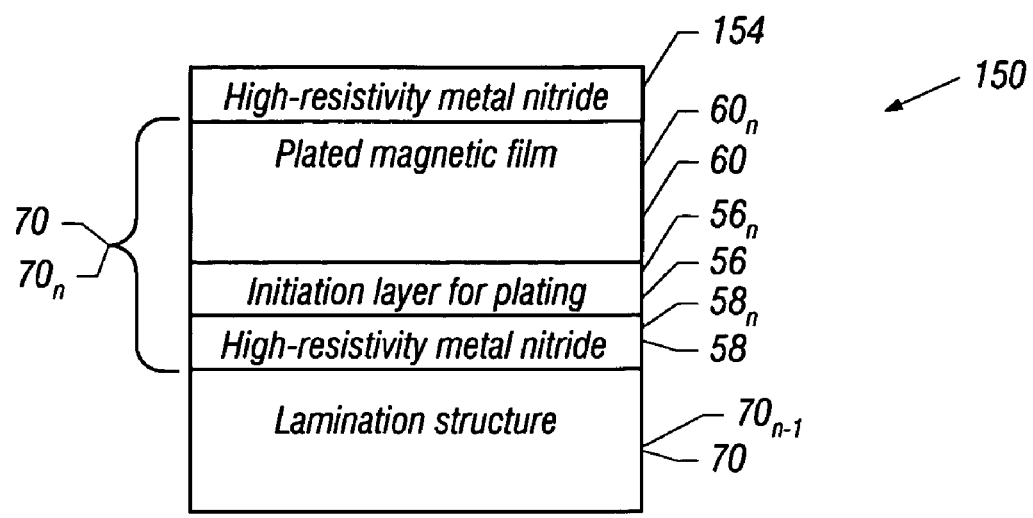
Figure 5:
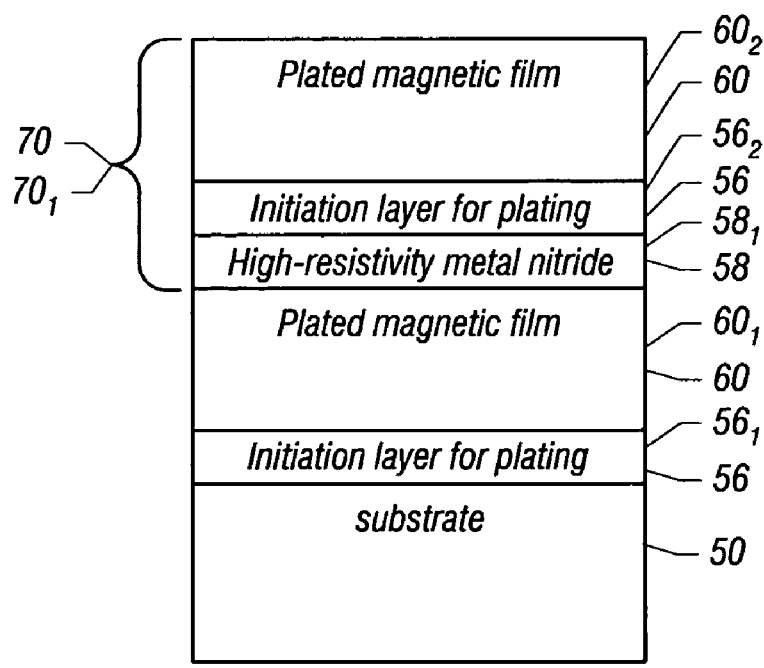

Referring to FIG. 5, as an example of another variation, a laminated magnetic material structure 150 may replace either structure 20 or 130, in accordance with other embodiments of the invention. The structure 150 is similar to the structure 20, with like reference numerals being used to denote similar elements. The structures 20 and 150 differ as follows. In particular, unlike the structure 20, the structure 150 includes a high-resistivity metal nitride layer 154 that is formed on the magnetic film $60n$ for purposes of integrating the structure with other circuitry that is fabricated on the substrate. Thus, many variations are possible and are within the scope of the appended claims.

Figure 6:
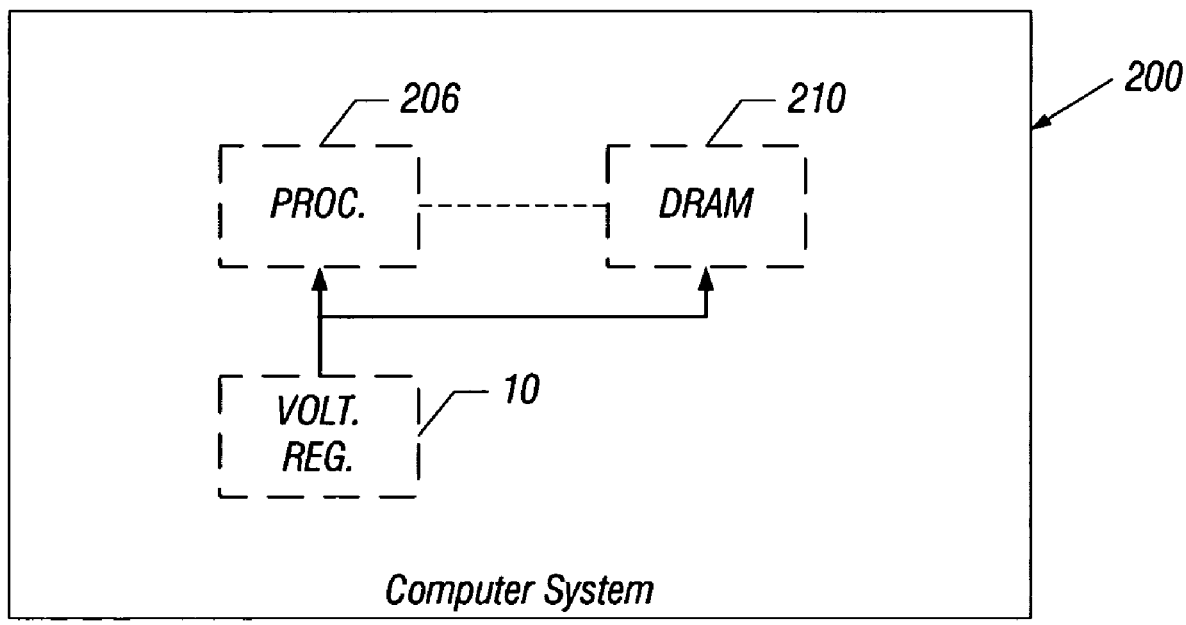
FIG. 6 is a schematic diagram of a computer system according to an embodiment of the invention.

The laminated magnetic material structure 20 (see FIG. 1) may be used in a variety of different applications, such as an exemplary computer system 200 that is depicted in FIG. 6. For example, the voltage regulator 10 of FIG. 1 may supply power to various components of the computer system 200, such as a processor 206 (one or more microprocessors or microcontrollers, as examples) and a memory, such as a dynamic random access memory (DRAM) 210.

While the invention has been disclosed with respect to a limited number of embodiments, those skilled in the art, having the benefit of this disclosure, will appreciate numerous modifications and variations therefrom. It is intended that the appended claims cover all such modifications and variations as fall within the true spirit and scope of the invention.

What is claimed is:

1. A method comprising:
    forming overlaying magnetic metal layers over a semiconductor substrate;
    forming at least one metal nitride layer between the magnetic metal layers;
    forming an initiation layer on one of said at least one metal nitride layer; and
    forming one of the magnetic metal layers on the initiation layer.

2. The method of claim 1, wherein each metal nitride layer is located between an adjacent pair of the magnetic metal layers.

3. The method of claim 1, wherein an electrical resistance of said at least one metal nitride layer is substantially greater than an electrical resistance of any of the magnetic metal layers.

4. The method of claim 3, wherein the electrical resistance of each of the metal nitride layers is approximately at least 20 times greater than the electrical resistance of each of the magnetic metal layers.

5. The method of claim 1, wherein the act of forming the magnetic metal layers comprises forming a magnetic core of an inductive device.

6. The method of claim 1, wherein said at least one metal nitride layer is formed by vapor deposition.

7. The method of claim 1, wherein the forming the overlaying magnetic metal layers comprises:
    plating a magnetic film; and
    applying a magnetic field during the plating.

8. The method of claim 1, further comprising:
    using the initiation layer as an electrode to electroplate said one of the magnetic metal layers on the initiation layer.

9. The method of claim 1, further comprising:
    using the initiation layer as a nucleation site to electrolessly form said one of the magnetic metal layers on the initiation layer.

10. A method comprising:
  forming a first magnetic metal layer over a semiconductor substrate;
  forming a metal nitride layer over the first magnetic metal layer;
  forming a second magnetic layer over the metal nitride layer; and
  forming an initiation layer on the metal nitride layer,
  wherein the forming the second magnetic layer comprises forming the second magnetic layer on the initiation layer.

11. The method of claim 10, wherein
  the forming the initiation layer comprises forming a metal layer on the metal nitride layer, and
  the forming the second magnetic layer comprises using the metal layer as an electrode to electroplate the second magnetic layer onto the metal layer.

12. The method of claim 10, wherein
  the forming the initiation layer comprises forming another layer on the metal nitride layer, and
  using said another layer as a nucleation site to electrolessly form the second magnetic layer on the metal nitride layer.

13. An apparatus comprising:
  a semiconductor substrate; and
  a laminated magnetic core fabricated on the substrate, comprising:
    magnetic metal layers formed over the substrate; and
    metal nitride layers located between the magnetic metal layers to impede eddy currents in the laminated magnetic core,
  wherein the laminated magnetic core comprises part of a voltage converter fabricated on the semiconductor substrate.

14. The apparatus of claim 13, wherein each of the metal nitride layers have a significantly higher electrical impedance than any of the magnetic metal layers.

15. The apparatus of claim 13, wherein the metal nitride layers comprise at least one of the following:
  TaN, TiN, WN and MoN.

16. The apparatus of claim 15, wherein at least one of the metal nitride layers comprises an alloy that includes one of carbon and silicon.

17. The apparatus of claim 13, wherein an electrical resistance of each of the metal nitride layers located between magnetic metal layers is approximately at least 20 times greater than the electrical resistance of each of the magnetic metal layers.

18. The apparatus of claim 13, further comprising:
  metal layers formed on layers located between the magnetic metal layers.

19. The apparatus of claim 18, wherein the layers located between the magnetic metal layers comprise metal nitride layers.

20. The apparatus of claim 13, further comprising:
  palladium layers formed on the metal nitride layers located between the magnetic metal layers.

21. A system comprising:
  a dynamic random access memory; and
  a converter to provide power to the dynamic random access memory, the converter comprising a semiconductor substrate and a laminated magnetic core fabricated on the semiconductor substrate, the laminated magnetic core comprising:
    magnetic metal layers formed over the semiconductor substrate; and
    metal nitride layers located between the magnetic metal layers to impede eddy currents in the laminated magnetic core.

22. The system of claim 21, further comprising:
  metal layers formed on the metal nitride layers located between the magnetic metal layers.

23. The system of claim 21, further comprising:
  palladium layers formed on the metal nitride layers located between the magnetic metal layers.

* * * * *